(12) United States Patent
Brown

(10) Patent No.: US 8,807,075 B2
(45) Date of Patent: Aug. 19, 2014

(54) SHUTTER DISK HAVING A TUNED COEFFICIENT OF THERMAL EXPANSION

(75) Inventor: Karl Brown, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 653 days.

(21) Appl. No.: 12/542,501

(22) Filed: Aug. 17, 2009

(65) Prior Publication Data

US 2010/0071625 A1 Mar. 25, 2010

Related U.S. Application Data

(60) Provisional application No. 61/099,090, filed on Sep. 22, 2008.

(51) Int. Cl.
 C23C 16/00 (2006.01)
 H01L 21/306 (2006.01)
 C23F 1/00 (2006.01)

(52) U.S. Cl.
 USPC .............. 118/504; 156/345.3; 156/345.19

(58) Field of Classification Search
 CPC .................................................. C23C 14/564
 USPC .................... 118/504; 156/345.3, 345.19
 See application file for complete search history.

(56) References Cited

U.S. PATENT DOCUMENTS

| | | | | |
|---|---|---|---|---|
| 3,381,660 A | * | 5/1968 | Bassan | 118/720 |
| 5,140,482 A | * | 8/1992 | Kimura et al. | 360/264.2 |
| 5,223,112 A | | 6/1993 | Tepman | |
| 6,162,297 A | * | 12/2000 | Mintz et al. | 118/715 |
| 6,190,513 B1 | * | 2/2001 | Forster et al. | 204/192.12 |
| 6,669,825 B2 | | 12/2003 | Ohmi et al. | |
| 6,736,946 B2 | | 5/2004 | Hixson et al. | |
| 6,827,825 B2 | | 12/2004 | Feltsman et al. | |
| 6,847,057 B1 | * | 1/2005 | Gardner et al. | 257/99 |
| 7,008,517 B2 | | 3/2006 | Feltsman | |
| 2002/0090464 A1 | | 7/2002 | Jiang et al. | |
| 2003/0094366 A1 | * | 5/2003 | Inaba et al. | 204/298.41 |
| 2004/0182698 A1 | * | 9/2004 | Feltsman | 204/298.11 |
| 2005/0048876 A1 | * | 3/2005 | West et al. | 451/37 |
| 2005/0051517 A1 | * | 3/2005 | Oehrlein et al. | 216/67 |
| 2005/0064247 A1 | * | 3/2005 | Sane et al. | 428/698 |
| 2005/0153059 A1 | | 7/2005 | Wakizaka | |
| 2007/0095651 A1 | | 5/2007 | Ye et al. | |
| 2007/0258075 A1 | * | 11/2007 | Kim et al. | 355/55 |
| 2008/0135859 A1 | * | 6/2008 | Cho et al. | 257/94 |

OTHER PUBLICATIONS

International Search Report and Written Opinion mailed Apr. 30, 2010 for PCT Application No. PCT/US2009/057663.
Chinese Search Report for Application No. 2009801380005 filed Sep. 21, 2009, 2 pages.

* cited by examiner

Primary Examiner — Keath Chen
(74) Attorney, Agent, or Firm — Moser Taboada; Alan Taboada

(57) ABSTRACT

A shutter disk having a tuned coefficient of thermal expansion is provided herein. In some embodiments, a shutter disk having a tuned coefficient of thermal expansion may include a body formed from a first material comprising at least two components, wherein a ratio of each of the at least two components to one another is selected to provide a coefficient of thermal expansion of the body that is substantially similar to a coefficient of thermal expansion of a second material to be deposited atop the body.

12 Claims, 2 Drawing Sheets

SHUTTER DISK HAVING A TUNED COEFFICIENT OF THERMAL EXPANSION

CROSS-REFERENCE TO RELATED APPLICATIONS

This application claims the benefit of U.S. provisional patent application Ser. No. 61/099,090, filed Sep. 22, 2008, and entitled "SHUTTER DISK AND SYSTEM WITH SHUTTER DISK," which is hereby incorporated by reference in its entirety.

BACKGROUND

1. Field

Embodiments of the present invention generally relate to the field of semiconductor process chambers, and more particularly, to shutter disks for use in semiconductor process chambers.

2. Description of the Related Art

Conventional semiconductor device formation is commonly performed in one or more process chambers, typically combined to form a multi-chamber processing system (e.g., a cluster tool) which has the capability to process multiple substrates (e.g., semiconductor wafers) in a controlled processing environment. To maintain process uniformity and ensure optimal performance of the process chamber, various conditioning operations are periodically performed. For example, in a physical vapor deposition (PVD) processing chamber, one commonly used conditioning operation is a "burn-in" process, wherein a target disposed in the PVD processing chamber is bombarded with plasma ions to remove oxides or other contaminants from the target prior to performing substrate processes. Another commonly used conditioning operation is a "pasting" process, wherein a covering is applied over material deposited on process chamber surfaces to prevent the material from flaking off the process chamber surfaces and contaminating the substrate during subsequent processes.

In both of the aforementioned conditioning operations, a shutter disk may be positioned via a transfer robot atop a substrate support disposed in the process chamber to prevent the deposition of any materials upon the substrate support. The shutter disk typically comprises a material having a mechanical stiffness sufficient enough to resist deformation due to the additional weight of the deposited material. For example, the shutter disk commonly comprises a metal alloy, such as stainless steel (SST), or a ceramic, such as silicon carbide (SiC).

However, shutter disks constructed of such materials weigh a substantial amount, leading to increased costs due to providing and maintaining a transfer robot capable of securely maneuvering the shutter disk. In addition, the coefficient of thermal expansion (CTE) is limited in range, resulting in a potentially significant difference between the coefficients of thermal expansion of the shutter disk and deposited materials, leading to diminished adhesion between the deposited material and the surface of the shutter disk, thus increasing the risk of the deposited material spalling or flaking off and contaminating the underlying substrate support. To alleviate this problem, the surface of the shutter disk may be textured via an abrasive blasting process to increase adhesion. However, due to the hardness of materials such as SST or SiC, such processes are difficult and costly.

SUMMARY

A shutter disk having a tuned coefficient of thermal expansion is provided herein. In some embodiments, a shutter disk having a tuned coefficient of thermal expansion may include a body formed from a first material comprising at least two components, wherein a ratio of each of the at least two components to one another is selected to provide a coefficient of thermal expansion of the body that is substantially similar to a coefficient of thermal expansion of a second material to be deposited atop the body.

In some embodiments, a process chamber may include a chamber body defining an inner volume having a target comprising materials to be deposited atop a substrate disposed therein; a substrate support disposed within the chamber body for supporting the substrate; a shutter disk for protecting the substrate support, the shutter disk comprising a body formed from a composite material having at least two components, wherein a ratio of each of the at least two components to one another is selected to provide a coefficient of thermal expansion of the body that is substantially similar to a coefficient of thermal expansion of materials to be deposited on the shutter disk; and a transfer robot movably coupled to the chamber body for transferring the shutter disk to the substrate support.

In some embodiments, a shutter disk having a tuned coefficient of thermal expansion may include a body having a top surface, bottom surface and a peripheral surface coupling the top surface to the bottom surface, wherein the body comprises aluminum and silicon provided in a ratio of aluminum to silicon of about 1:4 to about 7:3 and wherein the body has a coefficient of thermal expansion that is substantially similar to a coefficient of thermal expansion of a material to be deposited atop the body.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to semiconductor manufacturing processing chambers, and more particularly, to shutter disks. The inventive apparatus includes a shutter disk for use in conditioning operations of process chambers. The inventive apparatus may advantageously provide a light weight, cost effective shutter disk that is resistant to deformation and provides a tuned coefficient of thermal expansion and improved adhesive properties.

Figure 1:
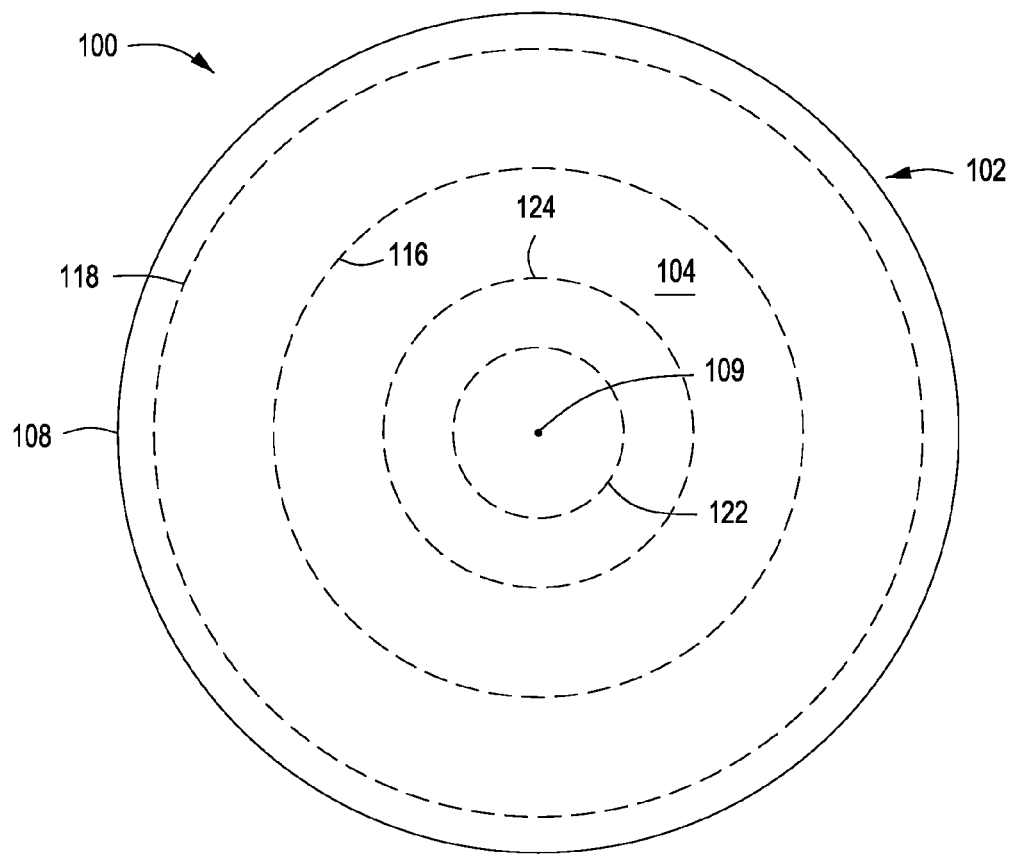
FIG. 1 is a top view of an exemplary shutter disk in accordance with some embodiments of the present invention.
Figure 1A:
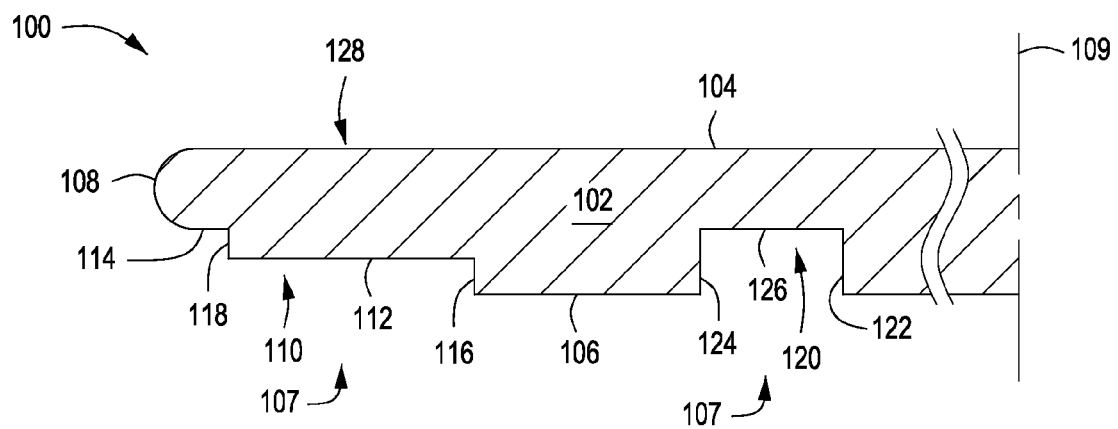
FIG. 1A depicts a partial cross sectional view from the center line of the exemplary shutter disk of FIG. 1, in accordance with some embodiments of the present invention.

FIG. 1 is a top view of an exemplary shutter disk in accordance with some embodiments of the present invention. FIG. 1A depicts a cross sectional view from the center line of the exemplary shutter disk of FIG. 1, in accordance with some embodiments of the present invention. To best understand the invention, the reader should refer simultaneously to FIGS. 1 and 1A. Although described herein as a disk, the shutter disk may have any suitable geometry as required to operate within a particular processing chamber.

The shutter disk 100 generally comprises a body 102 having a top surface 104 and bottom surface 106 and an outer diameter 108. Although discussed in terms of an outer diameter and referred to as a disk, the shutter disk 100 is not limited to round shapes and may have any shape suitable for use in a process chamber as disclosed herein. The bottom surface 106 may comprise features 107 to interface with the components of a transfer robot (not shown) to facilitate stable and precise movement.

The top surface 104 is generally planar and has an orientation substantially perpendicular to the centerline 109 of the body 102. The bottom surface 106 is also generally planar and has an orientation substantially perpendicular to the centerline 109 of the body 102. In some embodiments, the body 102 has an outer diameter 108 of about 6 to about 12 inches, for example about 6, 8, or 11.85 inches, and a thickness between the top surface 104 and bottom surface 106 of about 0.1 to about 0.25 inches, for example, about 0.15 inches.

In some embodiments, a double step 110 may be formed in the outer portion of the bottom surface 106, as shown in FIG. 1A. The double step 110 comprises an inner step 112 and an outer step 114. The inner step 112 and outer step 114 are substantially parallel to the bottom surface 106. An inner wall 116 separates the inner step 112 from the bottom surface 106. The outer step 114 extends further into the body 102 than the inner step 112 as referenced from the bottom surface 106. The outer step 114 is separated from the inner step 112 by an outer wall 118. The outer wall 118 and the inner wall 116 are substantially parallel to the centerline 109 of the body 102. In some embodiments, the transition between the outer step 114 and the top surface 104 may be rounded. A groove 120 may be formed in the bottom surface 106 of the body 102 radially inward of the inner step 112. In some embodiments, the groove 120 includes an inner groove wall 122, an outer groove wall 124 and a groove bottom 126. The inner groove wall 122 and outer groove wall 124 are substantially parallel to the centerline 109 of the body 102. The groove bottom 126 is substantially perpendicular to the centerline 109 of the body 102. In some embodiments, the groove bottom 126 extends further into the body 102 than the outer step 114 as referenced from the bottom surface 106.

The body 102 may be constructed of any suitable material having a mechanical stiffness sufficient enough to resist deformation due to the additional weight of materials which may be deposited atop the shutter disk 100. In some embodiments, the material may also be lightweight so as to allow the shutter disk 100 to be easily maneuvered by a transfer robot. In some embodiments, the body 102 may be constructed from a metal composite, such as aluminum silicon (AlSi). The body 102 may be fabricated via any method suitable for forming the desired shape, for example, mold casting, die casting, spray casting, spray deposition, or the like.

In some embodiments, the body 102 may comprise a first material having a coefficient of thermal expansion (CTE) substantially similar to a second material being deposited atop the shutter disk 100 to facilitate adequate adhesion between surface 128 of the shutter disk 100 and the material being deposited, thereby preventing the deposited material from flaking (e.g., falling off) and reducing particle generation. For example, in embodiments such where titanium (Ti) or titanium nitride (TiN) is to be deposited atop the shutter disk 100 (e.g., having a CTE of between about 9-11 ppm/° C.), the body 102 may comprise AlSi, having a CTE of about 9-11 ppm/° C., or about 11 ppm/° C. In some embodiments, a ratio of components of the material used to form the body 102 may be varied to provide a tunable CTE range. For example, in embodiments such as where the body 102 comprises AlSi, the ratio of aluminum to silicon may be from about 1:4 to about 7:3, resulting in a CTE of about 5 to about 17 ppm/° C. For example, in embodiments where the ratio of aluminum to silicon is about 1:3.5 to 1:4.5, and most preferably 1:4, the CTE may be about 5 ppm/° C. In embodiments where the ratio of aluminum to silicon is about 3:6.5 to 3:7.5 and most preferably 3:7, the CTE may be about 7 ppm/° C. In embodiments where the ratio of aluminum to silicon is about 1:0.75 to 1:1.25 and most preferably 1:1, the CTE may be about 11 ppm/° C. In embodiments where the ratio of aluminum to silicon is about 7:2.5 to 7:3.5 and most preferably 7:3, the CTE may be about 17 ppm/° C.

In some embodiments, the surface 128 of the body 102 may be textured to facilitate improve adhesion with a material deposited thereon, thereby preventing the deposited materials from falling off the shutter disk 100. The surface 128 of the body 102 may be textured by any process suitable to adequately texture or roughen the surface 128 of the body 102, for example, an abrasive blasting process, such as grit blasting, sand blasting, bead blasting, or the like. In some embodiments, such as where the body 102 comprises AlSi, the surface 128 of the body 102 may be textured to a roughness average of up to between about 600 to about 800 $R_a$, by a suitable process, for example, via a grit blasting process.

In some embodiments, a method of forming a shutter disk having a tuned CTE is also provided. For example, in some embodiments, the body 102 may be formed from a first material comprising at least two components, wherein a ratio of each of the at least two components with respect to one another is selected to provide a coefficient of thermal expansion of the body 102 that is substantially similar to a coefficient of thermal expansion of a second material to be deposited atop the body. In some embodiments the components of the first material may be aluminum and silicon. The ratio of aluminum to silicon may be selected to provide a desired coefficient of thermal expansion as discussed above (e.g., the ratio of aluminum to silicon may be from about 1:4 to about 7:3, resulting in a CTE of about 5 to about 17 ppm/° C.). The CTE of the second material may be determined and the ratio of the components of the first material may be selected to provide a CTE that substantially matches the CTE of the second material. For example, in some embodiments, titanium (Ti) or titanium nitride (TiN) is to be deposited atop the shutter disk 100. The CTE of titanium (Ti) or titanium nitride (TiN) is between about 9-11 ppm/° C. As such, the body 102 may comprise aluminum and silicon, having a controlled ratio of aluminum to silicon to provide a CTE of between about 9-11 ppm/° C., or about 11 ppm/° C.

Figure 2:
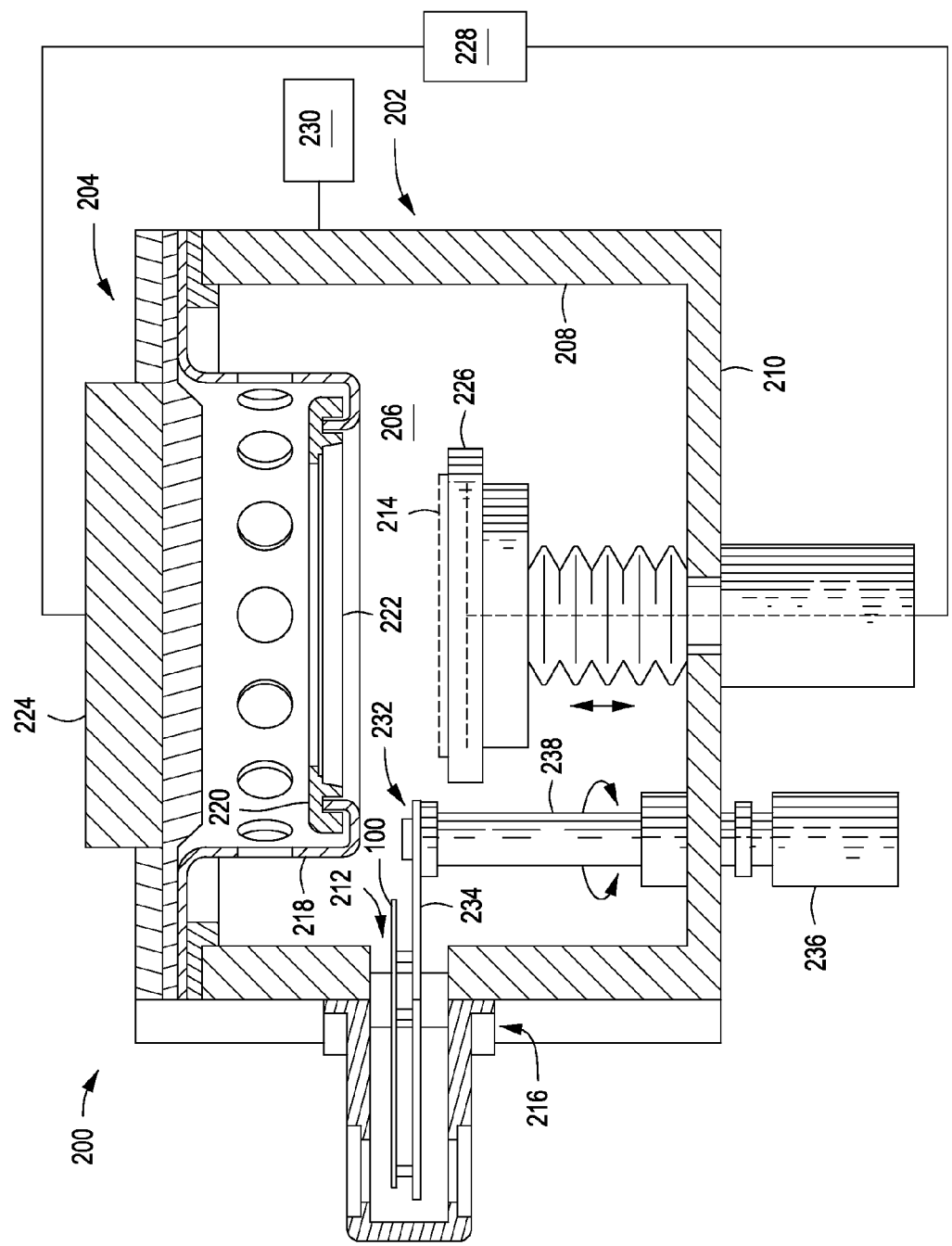
FIG. 2 is a schematic diagram of an exemplary processing chamber suitable for use in connection with some embodiments of the present invention.

FIG. 2 is a schematic diagram of an exemplary process chamber 200 for use in connection with some embodiments of the present invention. In some embodiments, the process chamber 200 may be one of a plurality of chambers combined to form a multi-chamber processing system (e.g., a cluster tool). In some embodiments, the process chamber 200 may be a deposition chamber, for example, a physical vapor deposition (PVD) chamber. An exemplary process chamber and a cluster tool that may be modified in accordance with the present invention are described in previously incorporated U.S. Provisional Patent Application 61/099,090, filed Sep. 22, 2008, and entitled "SHUTTER DISK AND SYSTEM WITH SHUTTER DISK."

The process chamber 200 includes a chamber body 202 and a lid assembly 204 that defines an evacuable process volume 206. The chamber body 202 generally includes sidewalls 208 and a bottom 210. The sidewalls generally contain a plurality of apertures that include an access port, pumping port and a shutter disk port 212 (access and pumping ports not shown). A sealable access port (not shown) provides for entrance and egress of the substrate 214 from the process chamber 100. The pumping port is coupled to a pumping system (not shown) that evacuates and controls the pressure within the process volume 206. The shutter disk port 212 is configured to allow at least a portion of a shutter disk 100 therethrough when the shutter disk 100 is in the cleared position. A housing 216 generally covers the shutter disk port 212 to maintain the integrity of the vacuum within the process volume 206.

The lid assembly 204 of the chamber body 202 generally supports an annular shield 218 suspended therefrom that supports a shadow ring 220. The shadow ring 220 is generally configured to confine deposition to a portion of the substrate 214 exposed through the center of the shadow ring 220. The lid assembly 204 generally comprises a target 222 and a magnetron 224.

The target 222 provides material that is deposited on the substrate 214 during the deposition process while the magnetron 224 enhances uniform consumption of the target material during processing. The target 222 and substrate support 226 are biased relative each other by a power source 228. An inert gas, for example, argon, is supplied to the process volume 206 from a gas source 230. A plasma is formed between the substrate 214 and the target 222 from the gas. Ions within the plasma are accelerated toward the target 222 and cause material to become dislodged from the target 222. The dislodged target material is attracted towards the substrate 214 and deposits a film of material thereon.

The substrate support 226 is generally disposed on the bottom 210 of the chamber body 202 and supports the substrate 214 during processing. A shutter disk mechanism 232 is generally disposed proximate the substrate support 226. The shutter disk mechanism 232 generally includes a blade 234 that supports the shutter disk 100 and an actuator 236 coupled to the blade 234 by a shaft 238.

The blade 234 may be moved between the cleared position shown in FIG. 2 and a second position that places the shutter disk 100 substantially concentric with the substrate support 226. In the second position, the shutter disk 100 may be transferred (by utilizing the lift pins) to the substrate support 226 during the target burn-in and chamber pasting processes. The blade 234 is returned to the cleared position during the target burn-in and chamber pasting processes. The actuator 236 may be any device that may be adapted to rotate the shaft 238 through an angle that moves the blade 234 between the cleared and second positions.

While the foregoing is directed to embodiments of the present invention, other and further embodiments of the invention may be devised without departing from the basic scope thereof, and the scope thereof is determined by the claims that follow.

The invention claimed is:

1. A shutter disk having a tuned coefficient of thermal expansion, comprising:
a body having a top surface, a bottom surface, and a peripheral surface coupling the top surface to the bottom surface, the bottom surface having an outer step adjacent the peripheral surface, an inner step adjacent the outer step, and an annular groove formed in the bottom surface, wherein the inner step is disposed radially inward of the outer step and the annular groove is disposed radially inward of the inner step, wherein a thickness of the body increases from the outer step to the inner step, wherein the body is formed from a first material comprising aluminum and silicon provided in a ratio of aluminum to silicon of about 1:4 to about 7:3, and wherein the ratio of aluminum to silicon provides coefficient of thermal expansion of the body that is substantially similar to a coefficient of thermal expansion of a second material comprising titanium (Ti) to be deposited atop the body.

2. The shutter disk of claim 1, wherein the coefficient of thermal expansion of the first material is about 5 to about 17 ppm/° C.

3. The shutter disk of claim 1, wherein at least one of the top surface, bottom surface or peripheral surface is textured.

4. The shutter disk of claim 3, wherein at least one of the top surface, bottom surface or peripheral surface is textured to a roughness average of up to between about 600 to about 800 $R_a$.

5. The shutter disk of claim 1, wherein the first material is a spray formed composite material.

6. The shutter disk of claim 1, wherein the coefficient of thermal expansion of the second material is between about 9 to about 11 ppm/° C.

7. A process chamber, comprising:
a chamber body defining an inner volume having a target comprising titanium (Ti) to be deposited atop a substrate disposed therein;
a substrate support disposed within the chamber body for supporting the substrate;
a shutter disk for protecting the substrate support, the shutter disk comprising a body having a top surface, a bottom surface and a peripheral surface coupling the top surface to the bottom surface, the bottom surface having an outer step adjacent the peripheral surface, an inner step adjacent the outer step, and an annular groove formed in the bottom surface, wherein the inner step is disposed radially inward of the outer step and the annular groove is disposed radially inward of the inner step, wherein a thickness of the body increases from the outer step to the inner step, wherein the body is formed from a composite material comprising aluminum and silicon provided in a ratio of aluminum to silicon of about 1:4 to about 7:3, and wherein the ratio of aluminum to silicon provides a coefficient of thermal expansion of the body that is substantially similar to a coefficient of thermal expansion of the titanium (Ti) to be deposited on the shutter disk; and
a transfer robot movably coupled to the chamber body for transferring the shutter disk to the substrate support.

8. The shutter disk of claim 7, wherein the coefficient of thermal expansion of the composite material is between about 5 to about 17 ppm/° C.

9. The shutter disk of claim 7, wherein the composite material is a spray formed composite material.

10. The shutter disk of claim 7, wherein at least one of the top surface, bottom surface or peripheral surface is textured.

11. The shutter disk of claim 10, wherein at least one of the top surface, bottom surface or peripheral surface is textured to a roughness average of up to between about 600 to about 800 $R_a$.

12. The process chamber of claim 7, wherein the coefficient of thermal expansion of the materials to be deposited atop the substrate is between about 9 to about 11 ppm/° C.

* * * * *